United States Patent
Price et al.

(10) Patent No.: US 6,239,977 B1
(45) Date of Patent: May 29, 2001

(54) TECHNIQUE FOR MOUNTING ELECTRONIC COMPONENTS ON PRINTED CIRCUIT BOARDS

(75) Inventors: Tim Urry Price, Salt Lake City; Patrick A. Tucker, Sandy, both of UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/312,791

(22) Filed: May 17, 1999

(51) Int. Cl.[7] .............................. H05K 7/02; H05K 1/00; H01H 85/04
(52) U.S. Cl. .................... 361/737; 361/761; 361/807; 439/69; 337/4; 337/297
(58) Field of Search .................... 361/736, 737, 361/760, 761, 796, 807–810; 439/500, 69; 174/260; 337/4, 251, 260, 297, 405

(56) References Cited

U.S. PATENT DOCUMENTS

| 4,653,822 | * | 3/1987 | Kanazawa | 439/69 |
| 4,806,808 | * | 2/1989 | Grecksch et al. | 310/71 |
| 5,055,637 | * | 10/1991 | Hagner | 174/260 |
| 5,386,343 | * | 1/1995 | Pao | 361/761 |
| 5,631,807 | * | 5/1997 | Griffin | 361/794 |
| 5,712,767 | * | 1/1998 | Koizumi | 361/761 |
| 5,736,918 | * | 4/1998 | Douglass | 337/186 |
| 5,889,654 | * | 3/1999 | Pierson et al. | 361/720 |
| 5,943,216 | * | 8/1999 | Schmidt | 361/761 |
| 5,994,648 | * | 11/1999 | Glovatsky et al. | 174/260 |
| 5,999,412 | * | 12/1999 | Busse et al. | 361/761 |
| 6,077,106 | * | 6/2000 | Mish | 439/500 |

* cited by examiner

Primary Examiner—Jayprakash N. Gandhi
(74) Attorney, Agent, or Firm—Michaelson & Wallace; Peter L. Michaelson

(57) ABSTRACT

A PCMCIA (Personal Computer Memory Card International Association) modem card includes a PCB (printed circuit board) sealed in a slender enclosure, typically the size of a credit card. The PCB contains a hole for receiving a drop-in electronic component, such as a resetting fuse. The fuse comprises a block of positive-temperature-coefficient material sandwiched between a pair of parallel contacts. Each contact includes a tab for surface mounting the fuse to an array of conductive films located on the surface of the PCB. The tabs lie in a common plane and in a plane parallel to the planes of the contacts.

13 Claims, 3 Drawing Sheets

TECHNIQUE FOR MOUNTING ELECTRONIC COMPONENTS ON PRINTED CIRCUIT BOARDS

BACKGROUND OF THE INVENTION

1. Field of the Invention

The present invention relates generally to the design and manufacture of printed circuit board (PCB) assemblies. More particularly, it relates to improved techniques of mounting components on a printed circuit board (PCB) assembly.

2. Description of the Prior Art

Modular construction techniques are widely used to manufacture various electronic devices, including computer apparatus and computer peripherals. With modular techniques, a manufacturer can economically assemble several variations of an electronic device using different combinations of pre-assembled modular circuits, which they typically mount on removable printed circuit boards (PCB's). Additionally, modular construction permits vendors to routinely assemble and/or service different variations of an electronic system at a point of sale. Further, end users are often capable of adding, removing or replacing some modular electronic components with little effort and skill. Indeed, some manufacturers have fabricated optional electronic components as small add-in cards that users plug into narrow slots accessible to the exterior of the apparatus. For instance, laptop, palmtop, and other portable computers, as well as a variety of mobile intelligent electronic devices frequently employ small add-in cards and slots, which function as peripherals or other optional circuits.

One particular add-in device is referred to as a PC Card, a trademark of the Personal Computer Memory Card International Association (PCMCIA), which sets standards for their construction. A typical PC Card, also called a PCMCIA card, is approximately the size of a credit card and includes a low-profile PCB assembly sealed within a slender housing. One standard type of PCMCIA card is only about 3.3 millimeters thick and is intended to be used primarily as a memory-related peripheral. A second type of PCMCIA card is approximately 5 millimeters thick and accommodates devices such as modem, fax and network cards. A third type of PCMCIA card, which is about 10.5 millimeters thick, accommodates devices that require more space, such as wireless communications devices and rotating storage media (such as hard disks).

When fabricating PCMCIA cards and other compact PCB structures, manufacturers often employ surface-mount technology (SMT), which relates to techniques of fixing components directly to the surface of a PCB instead of soldering them into holes pre-drilled for that purpose. Advantages of using SMT include device compactness, resistance to vibration, and a capacity for dense interconnections on both sides of a PCB. These advantages make SMT particularly suitable for fabricating conventional PCMCIA cards and other low-profile electronic devices.

Because PCMCIA cards and similar devices normally contain a surface-mounted PCB sealed within an enclosure, their internal components are generally inaccessible to a user. Thus, manufacturers seldom include components within a PCMCIA card or similar device that commonly need servicing. Circuit components that are transient in nature, such as protective fuses and relays, usually mount away from a PCMCIA card. In those instances where the fuse mounts away from the PCMCIA card, e.g., in a separate enclosure mounted within a computer apparatus, a user or service facility can usually replace or reset the fuse with little effort. However, in those instances where a protective fuse mounts within a PCMCIA card, a user would need to return the PCMCIA card to a manufacturer for servicing or replacement whenever a component failed, e.g., when a fuse opened. To service a fuse in a PCMCIA card, a manufacturer would usually need to unseal the enclosure, replace or reset the fuse, and reseal the PCB, usually in a new enclosure. In many situations, manufacturers find it less expensive to simply send the user a new PCMCIA card rather than service to old one.

Those concerned with the development of PCMCIA cards and like devices have recognized the disadvantages associated with the inaccessibility of such devices. While locating switches and fuses away from a PCMCIA card can make those components more accessible to a user, it usually increases the overall construction costs to a manufacturer of a computer apparatus. By using the alternative approach, i.e., surface mounting switches and fuses in a PCMCIA card, the initial manufacturing costs can be lessened. However, that approach will normally increase the overall maintenance and servicing costs of such devices. Notwithstanding the cost factors, it is not always possible to locate certain components within a PCMCIA card. Many of the conventional surface-mountable components that are small enough to fit within the limited space available in a typical PCMCIA card do not have the required voltage ratings. For that reason, manufacturers must mount those components in the computer apparatus away from a PCMCIA card or like device. Consequently, those concerned with the development and manufacture of electronic equipment have long recognized a need for improved techniques of designing PCMCIA cards and other compact PCB structures.

SUMMARY OF THE INVENTION

The present invention satisfies a need in the art by providing a printed circuit board assembly having a printed circuit board with a hole formed therein and an array of conductive films deposited thereon. A first electronic component mounts in the hole. The first electronic component has a pair of opposed, conductive contacts located on opposite sides thereof. The conductive contacts connect to the array of conductive films. A set of other electronic components mount on the printed circuit board and connect to the array of conductive films.

In addition, a pair of conductive tabs each connects to a different one of the conductive contacts and to the array of conductive films. The tabs are located adjacent opposite sides of the first electronic component and include planar surfaces that lie in a common plane. The conductive contacts and the tabs lie in parallel planes, and the tabs connect to the array of conductive films located on a common side of the printed circuit board. The contacts are surface mounted to the PCB.

More specifically, the first electronic component is a resetting fuse formed from a block of positive-temperature-coefficient material sandwiched between the conductive contacts. In addition, the printed circuit board mounts in an enclosure having a thickness in the order of substantially ten millimeters or less to form a PCMCIA card.

Another aspect of the invention involves a method of forming a printed circuit board assembly. The method comprises forming a hole in a printed circuit board having an array of conductive films mounted thereon. An electronic component is formed with a pair of opposed conductive contacts mounted on a first set of opposite sides thereof.

Conductive tabs are connected to different ones of the conductive contacts and extend to a second set of opposite sides of the electronic component. An electronic component drops into the hole with the tabs contacting the array of conductive films and with the conductive contacts located on opposite sides of the printed circuit board. The electronic components are surface mounted to the printed circuit board.

In addition, the conductive tabs are formed into a common plane while the opposed conductive contacts and the tabs are positioned into parallel planes. The step of forming the electronic component includes sandwiching a block of positive-temperature-coefficient material between the conductive contacts.

Still, another aspect of the invention involves PCMCIA modem card having a PCB sealed in a slender enclosure, typically the size of a credit card. The PCB contains a hole for receiving a drop-in electronic component, such as a resetting fuse. The fuse comprises a block of positive-temperature-coefficient material sandwiched between a pair of parallel contacts. Each contact includes a tab for surface mounting the fuse to an array of conductive films located on the surface of the PCB. The tabs lie in a common plane and in a plane parallel to the planes of the contacts.

BRIEF DESCRIPTION OF THE DRAWINGS

The teachings of the present invention can be readily understood by considering the following detailed description in conjunction with the accompanying drawings, in which.

DETAILED DESCRIPTION OF THE PREFERRED EMBODIMENT

Figure 1:
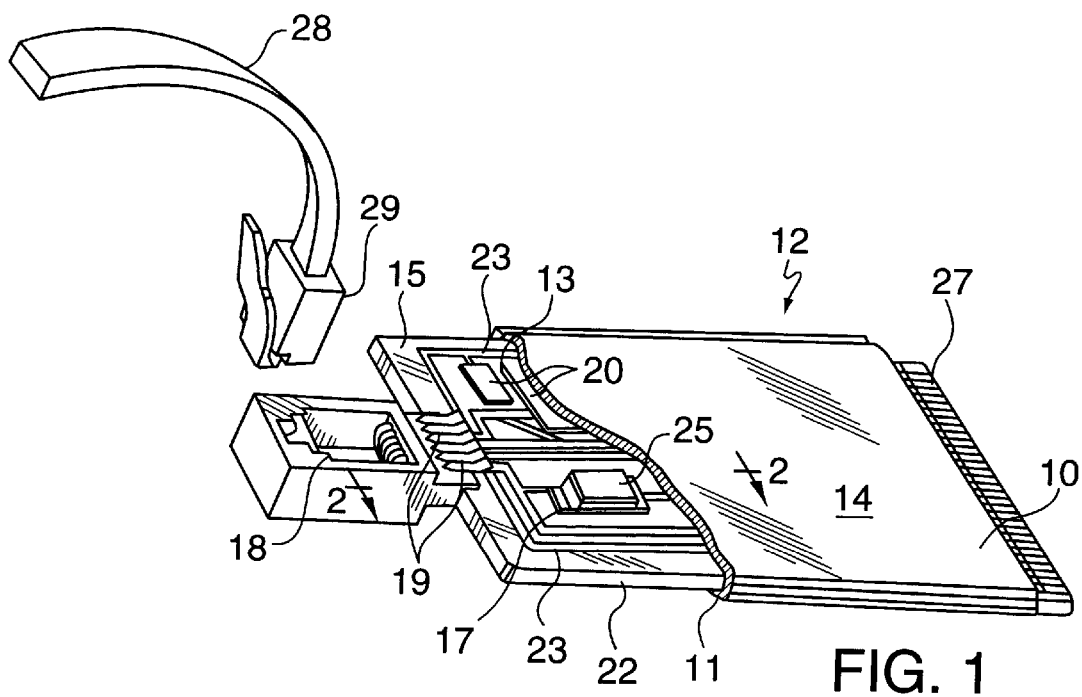
FIG. 1 is a pictorial exploded view with parts broken away of a PCMCIA modem card made in accordance with the present invention.
Figure 2:
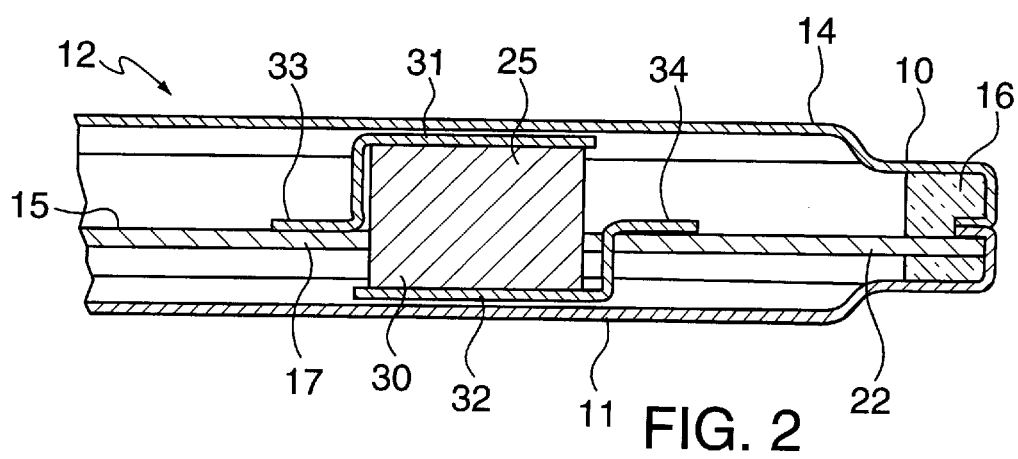
FIG. 2 is an elevation in cross section taken on the line 2—2 of FIG. 1 and looking in the direction of the arrows.

Referring now to the drawings, FIGS. 1 and 2 depict a compact printed circuit board (PCB) structure, specifically PCMCIA modem card 12, carrying modem circuit 13. While the present invention is applicable to a variety of PCB-type structures and electronic circuits, the preferred embodiment is illustratively described with respect to a modem card in a PCMCIA environment.

PCMCIA modem card 12 includes PCB assembly 15 housed in a slender enclosure 14. PCB assembly 15 comprises a relatively rigid board 22 of non-conducting material, such as plastic or fiberglass, which holds an array of conductive films 23 deposited thereon. Films 23 form conductive pathways that interconnect a number of surface-mounted electronic components 20, which form modem circuit 13. In addition, a resetting-type fuse 25 resides in opening 17 and surface mounts on modem card 12. Fuse 25 protects modem circuit 13 against damage from excessive currents. Enclosure 14 comprises an upper cover 10 and lower cover 11. A plastic seal 16 joins the edges of board 22 and covers 10 and 11 into a rigid structure. Manufacturers typically use an ultrasonic sealing process to activate seals, such as seal 13, when mounting PCB's within an enclosure.

Modem card 12 is also equipped with external socket connector 18, which mounts on an edge of board 22 and connects to conductive films 23 via leads 19. FIG. 1 illustratively depicts connector 18 as a standard RJ-11 connector. As such, connector 18 is designed to detachably receive a conventional twisted-pair telephone wire 28 via RJ-11 plug 29. The opposite edge of modem card 12 contains a conventional edge connector 27, designed to mate with a corresponding set of contacts located in a standard PCMCIA slot (not shown).

Figure 3:
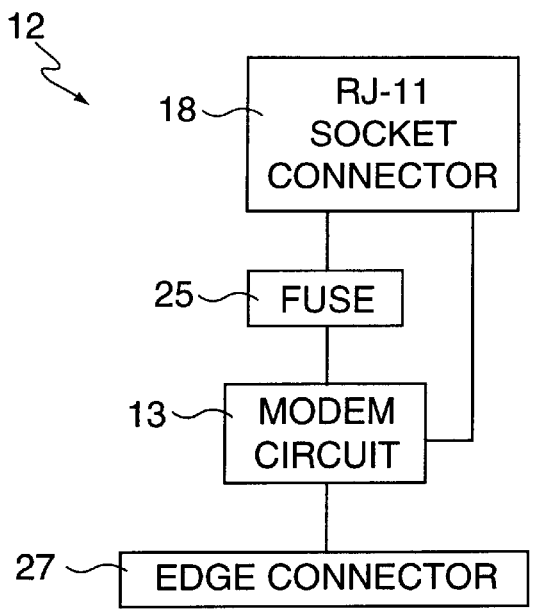
FIG. 3 is a high-level schematic block diagram of the PCMCIA modem card of FIG. 1.
Figure 4:
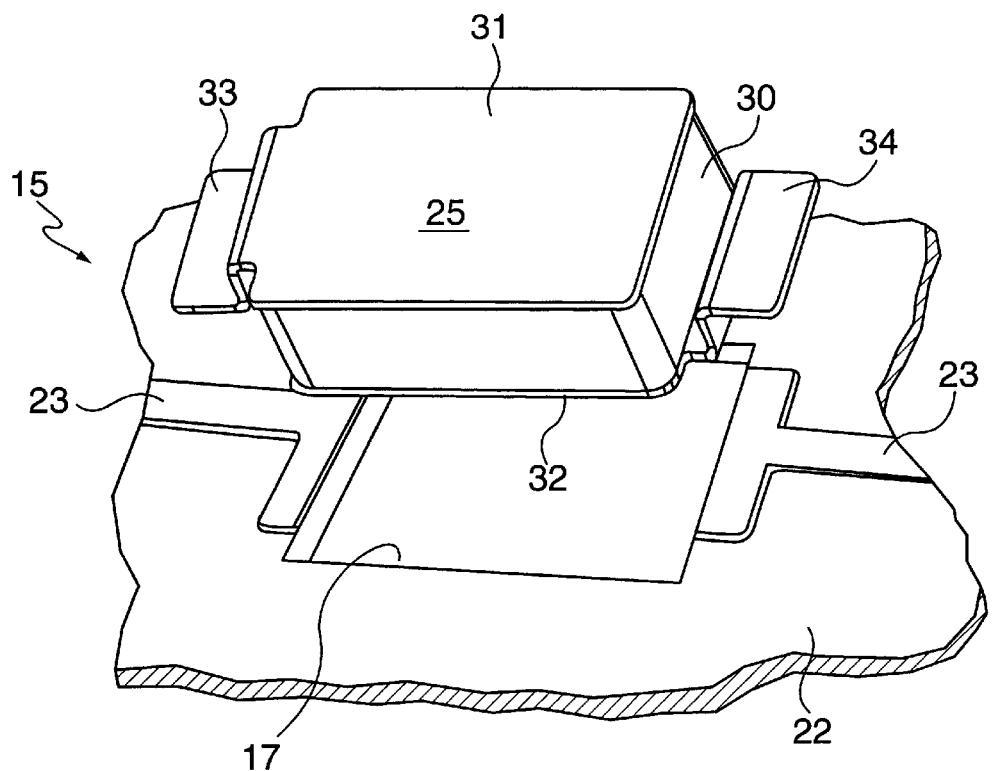
FIG. 4 is a pictorial exploded view with parts broken away showing a portion of the PCMCIA modem card of FIGS. 1 and 2.
Figure 5:
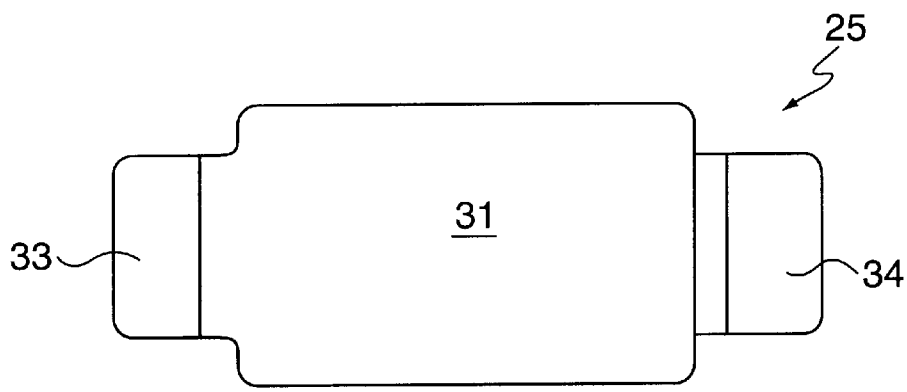
FIG. 5 is a top view of the fuse shown in FIG. 4.
Figure 6:
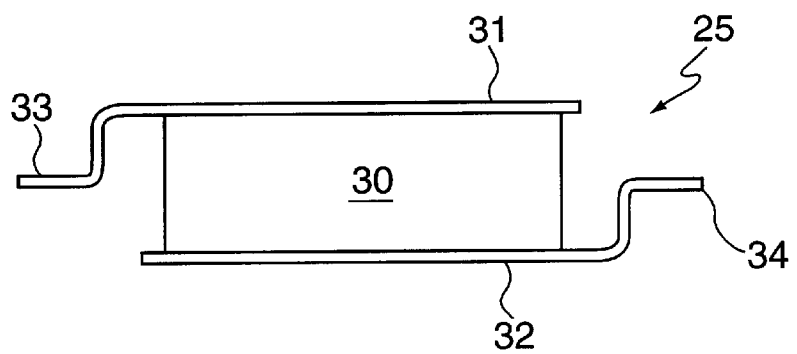
FIG. 6 is a front elevation of the fuse shown in FIGS. 4 and 5.
Figure 7:
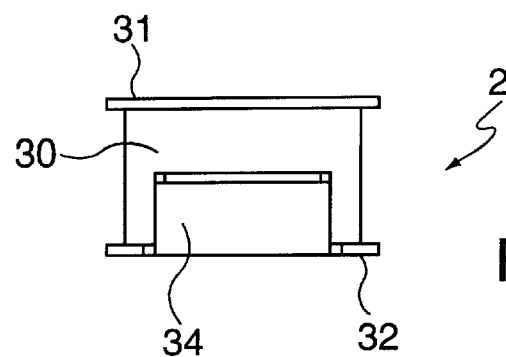
FIG. 7 is a side elevation of the fuse shown in FIGS. 4–6.

The high-level block diagram of FIG. 3 schematically depicts the major components of modem card 12. FIG. 3 shows resetting-type fuse 25 connected between modem circuit 13 and RJ-11 socket connector 18. Resetting-type fuse 25 preferably contains a conventional positive-temperature-coefficient (PTC) material that exhibits a rapid increase in resistance when its internal temperature rises, typically due to excessive current. The increase in resistance of fuse 25 effectively "opens" the circuit that includes modem circuit 13 and RJ-11 socket connector 18. When the internal temperature of the PTC material subsequently falls, the internal resistance decreases to an operational level, essentially resetting fuse 25 and closing the circuit between modem circuit 13 and RJ-11 socket connector 18.

As best illustrated in FIGS. 4–7, fuse 25 includes a block of PTC material 30 sandwiched between upper conductive contact 31 and lower conductive contact 32. Mounting tabs 33 and 34, which extend from respective contacts 31 and 32, bend into a common horizontal plane. FIG. 2 shows tabs 33 and 34 surface mounted on the upper surface of board 22. The characteristics of fuse 25 make it particularly suitable for mounting in a PCMCIA-type environment. First, since fuse 25 is resetting, there is no need to mount it away from the PCMCIA board. This feature will render the overall product less expensive to manufacture and service. Second, the "drop-in" configuration of fuse 25 and its corresponding opening 17 enables easy automatic assembly of fuse 25 onto board 22 using conventional SMT. Third, by simply bending tabs 33 and 34 at different locations, fuse 25 will readily adjust to a different spacing between board 22 and covers 10 and 11. Since fuse 25 surface mounts in opening 17 and extends a substantial amount between covers 10 and 11, the voltage rating of fuse 25 may be maximized for a given thickness of enclosure 14. In this regard, to reduce the possibility of arc-around, a conformal insulating coating can be applied to the sides of PTC material 30. The offset configuration of terminals 33 and 34 are such that arc-over is minimized. The invention contemplates that unlike conventional surface mounted fuses, fuse 25 will readily meet the required voltage rating to meet the Underwriter Laboratory standard UL 1950 3rd Edition.

Various modifications of the invention are contemplated. It is to be understood, therefore, that within the scope of the appended claims, the invention may be practiced otherwise than as specifically described.

What is claimed is:

1. A printed circuit board assembly comprising:
    a printed circuit board having extended upper and lower surfaces, a hole formed therein, and an array of conductive films deposited thereon;
    a first electronic component mounted in said hole, said first electronic component having a component body with broad upper and lower major faces and a pair of opposed conductive contacts, each said conductive contact including a relatively broad layer of conductive material deposited on respective ones of said major faces, said body extending through said hole such that said conductive contacts are respectively located above said upper surface and below said lower surface, a pair of conductive tabs joined to said conductive contacts, and each of said conductive tabs connecting a different one of said conductive contacts to said array of conductive films; and a set of other electronic components mounted on said printed circuit board and connected to said array of conductive films.

2. The assembly of claim 1, wherein said tabs are located adjacent opposite sides of said first electronic component, said sides are transverse to said major faces and said tabs are spaced from said component body.

3. The assembly of claim 2, wherein said conductive contacts are flat and lie in spaced parallel planes, and said tabs include coplanar surfaces that connect to said array of conductive films on a common one of said surfaces of said printed circuit board, and wherein the plane of said coplanar surfaces is parallel to and extends intermediate said spaced parallel planes of said conductive contacts.

4. The assembly of claim 3, wherein said first electronic component is a resetting fuse.

5. The assembly of claim 4, wherein said component body of said first electronic component includes a block of positive-temperature-coefficient material sandwiched between said conductive contacts.

6. The assembly of claim 5, wherein said printed circuit board mounts in an enclosure having a thickness in the order of substantially ten millimeters or less to form a PCMCIA card.

7. The assembly of claim 6, wherein said first electronic component and said other electronic components are surface mounted on said printed circuit board.

8. A resetting fuse for mounting on a printed circuit board comprising:

a component body including a block of positive-temperature-coefficient material;

a pair of opposed conductive contacts located on a first set of opposite sides of said component body, and said block of positive-temperature-coefficient material sandwiched between said conductive contacts; and a pair of conductive tabs each connected to a different one of said conductive contacts, wherein said conductive tabs are located on a second set of opposite sides of said component body, and wherein said tabs include planar surfaces that lie in a common plane, and wherein said conductive contacts and said tabs lie in parallel planes.

9. A resetting fuse for mounting on a printed circuit board comprising:

a block of positive-temperature-coefficient material having a pair of spaced upper and lower major faces;

a pair of conductive contacts, each said conductive contact including a broad layer of conductive material deposited on respective ones of said major faces such that said block of positive-temperature-coefficient material is sandwiched between said conductive contacts; and a pair of spaced conductive tabs, each said tab connected to a different one of said conductive contacts and positioned adjacent and spaced from different sides of said block of positive-temperature-coefficient material, and said sides being transverse to said upper and lower major faces.

10. The resetting fuse of claim 9, wherein said conductive contacts are planar and lie in spaced parallel planes, and said tabs include coplanar terminals that extend parallel to and intermediate said upper and lower major faces.

11. A method of forming a printed circuit board assembly comprising:

forming a hole in a printed circuit board having an array of conductive films mounted thereon;

forming an electronic component with a pair of broad, planar conductive contacts mounted in spaced parallel planes on a first set of opposite sides of said electronic component;

sandwiching a block of positive-temperature-coefficient material between said conductive contacts;

forming a pair of conductive tabs each connected to a different one of said conductive contacts and extending to a second set of opposite sides of said electronic component, said second set of opposite sides being transverse to said first set of opposite sides;

dropping said electronic component into said hole with said tabs contacting said array of conductive films and with said printed circuit board lying in a plane located between and parallel to the planes of said conductive contacts; and surface mounting said electronic component to said printed circuit board.

12. The method of claim 11, wherein said step of forming a pair of conductive tabs includes positioning terminal portions of said tabs into a common plane located between and parallel to the planes of said conductive contacts.

13. The method of claim 12, wherein said step of forming an electronic component includes sandwiching a block of positive-temperature-coefficient material between said conductive contacts.

* * * * *